US006859098B2

(12) United States Patent
Husseini

(10) Patent No.: US 6,859,098 B2
(45) Date of Patent: Feb. 22, 2005

(54) APPARATUS, METHODS AND ARTICLES OF MANUFACTURE FOR CONTROL IN AN ELECTROMAGNETIC PROCESSOR

(75) Inventor: Radwan M. R. Husseini, Annandale, NJ (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 10/348,542

(22) Filed: Jan. 17, 2003

(65) Prior Publication Data

US 2004/0140851 A1 Jul. 22, 2004

(51) Int. Cl.[7] .................................................. H03G 3/20
(52) U.S. Cl. ....................................... 330/133; 330/136
(58) Field of Search ................................ 330/133, 134, 330/136, 284, 285

(56) References Cited

U.S. PATENT DOCUMENTS 3,978,422 A 8/1976 Rheinfelder
4,580,111 A 4/1986 Swanson
4,586,000 A 4/1986 Wagner
4,646,359 A 2/1987 Furrer
4,901,032 A 2/1990 Komiak ...................... 330/277
5,056,109 A 10/1991 Gilhousen et al.
5,257,283 A 10/1993 Gilhousen et al.
5,265,119 A 11/1993 Gilhousen et al.
5,267,262 A 11/1993 Wheatley, III
5,278,997 A 1/1994 Martin
5,311,143 A 5/1994 Soliday
5,339,046 A 8/1994 Kornfeld et al.
5,396,516 A 3/1995 Padovani et al.
5,408,697 A 4/1995 Price et al.
5,410,280 A 4/1995 Linguet et al.
5,432,473 A * 7/1995 Mattila et al. .............. 330/133
5,437,055 A 7/1995 Wheatley, III
5,442,322 A 8/1995 Kornfeld et al.
5,452,473 A 9/1995 Weiland et al.
5,485,486 A 1/1996 Gilhousen et al.
5,561,395 A 10/1996 Melton et al. ................. 330/2
5,576,662 A 11/1996 Price et al.
5,577,265 A 11/1996 Wheatley, III
5,590,408 A 12/1996 Weiland et al.
5,642,002 A 6/1997 Mekanik et al.
5,655,220 A 8/1997 Weiland et al.
5,703,902 A 12/1997 Ziv et al.
5,774,017 A 6/1998 Adar
5,812,607 A 9/1998 Hutchinson, IV et al.
5,818,298 A 10/1998 Dent et al.
5,880,633 A 3/1999 Leizerovich et al.
5,892,431 A 4/1999 Osterman
5,903,554 A 5/1999 Saints
5,930,128 A 7/1999 Dent
5,936,464 A * 8/1999 Grondahl ................ 330/136 X
5,939,951 A 8/1999 Bateman et al.
5,942,946 A 8/1999 Su et al.
5,952,895 A 9/1999 McCune, Jr. et al.
6,043,707 A 3/2000 Budnik
6,043,712 A 3/2000 Leizerovich et al.
6,047,168 A 4/2000 Carlsson et al. ............ 455/126
6,075,413 A 6/2000 Katakura (List continued on next page.)

FOREIGN PATENT DOCUMENTS

WO WO 01/10013 A1 2/2001
WO WO 2004/034664 A2 4/2004

OTHER PUBLICATIONS

Hulick, "The Digital Linear Amplifier", Schwenksville, Pennsylvania.

(List continued on next page.)

*Primary Examiner*—Steven J. Mottola

(57) ABSTRACT

An apparatus for electromagnetic processing comprises a controller and a processor for receiving an input signal. The processor comprises one or more stages in communication with the controller. The controller is capable of regulating the input signal and the one or more stages to generate an output signal.

20 Claims, 8 Drawing Sheets

U.S. PATENT DOCUMENTS

| | | | | |
|---|---|---|---|---|
| 6,075,974 | A | 6/2000 | Saints et al. | |
| 6,078,628 | A | 6/2000 | Griffith et al. | |
| 6,094,101 | A | 7/2000 | Sander et al. | |
| 6,097,252 | A | 8/2000 | Sigmon et al. | |
| 6,101,224 | A | 8/2000 | Lindoff et al. | |
| 6,112,071 | A | 8/2000 | McCune, Jr. | |
| 6,133,788 | A | 10/2000 | Dent | |
| 6,140,875 | A | 10/2000 | Van Den Homberg et al. | |
| 6,140,882 | A | 10/2000 | Sander | |
| 6,147,553 | A | 11/2000 | Kolanek | |
| 6,157,681 | A | 12/2000 | Daniel et al. | |
| 6,185,432 | B1 | 2/2001 | Vembu | |
| 6,191,653 | B1 | 2/2001 | Camp, Jr. et al. | |
| 6,198,347 | B1 | 3/2001 | Sander et al. | |
| 6,201,452 | B1 | 3/2001 | Dent et al. | |
| 6,215,355 | B1 | 4/2001 | Meck et al. | |
| 6,219,394 | B1 | 4/2001 | Sander | |
| 6,236,284 | B1 | 5/2001 | Duello et al. | |
| 6,242,975 | B1 | 6/2001 | Eidson et al. | |
| 6,246,286 | B1 | 6/2001 | Persson | |
| 6,255,906 | B1 | 7/2001 | Eidson et al. | |
| 6,259,901 | B1 | 7/2001 | Shinomiya et al. | |
| 6,259,928 | B1 | 7/2001 | Vembu | |
| 6,269,135 | B1 | 7/2001 | Sander | |
| 6,285,251 | B1 | 9/2001 | Dent et al. | |
| 6,288,916 | B1 | 9/2001 | Liu et al. | |
| 6,294,957 | B1 | 9/2001 | Luu | |
| 6,311,046 | B1 | 10/2001 | Dent | |
| 6,317,608 | B1 | 11/2001 | Glöcker | |
| 6,321,072 | B1 | 11/2001 | Cipriani et al. | |
| 6,323,731 | B1 | 11/2001 | McCune, Jr. | |
| 6,330,462 | B1 | 12/2001 | Chen | |
| 6,351,650 | B1 | 2/2002 | Lundby et al. | |
| 6,356,155 | B1 | 3/2002 | Judkins | |
| 6,366,177 | B1 | 4/2002 | McCune et al. | |
| 6,369,657 | B2 | 4/2002 | Dening et al. | |
| 6,370,109 | B1 | 4/2002 | Schwartz et al. | |
| 6,374,085 | B1 | 4/2002 | Saints et al. | |
| 6,377,784 | B2 | 4/2002 | McCune | |
| 6,380,802 | B1 | 4/2002 | Pehike et al. | |
| 6,404,823 | B1 | 6/2002 | Grange et al. | |
| 6,411,655 | B1 | 6/2002 | Holden et al. | |
| 6,421,327 | B1 | 7/2002 | Lundby et al. | |
| 6,426,677 | B1 | 7/2002 | Prentice | |
| 6,426,678 | B1 | 7/2002 | Ko | |
| 6,430,402 | B1 | 8/2002 | Agahi-Kesheh | |
| 6,445,247 | B1 | 9/2002 | Walker | |
| 6,449,465 | B1 | 9/2002 | Gailus et al. | |
| 6,480,472 | B1 | 11/2002 | Jou et al. | |
| 6,490,460 | B1 | 12/2002 | Soliman | |
| 6,529,716 | B1 | 3/2003 | Eidson et al. | 455/115 |
| 2001/0026579 | A1 | 10/2001 | Mollenkopf et al. | |
| 2002/0090920 | A1 | 7/2002 | McCune | 455/110 |
| 2002/0132652 | A1 | 9/2002 | Steel et al. | 455/574 |
| 2002/0136325 | A1 | 9/2002 | Pehlke et al. | 375/300 |

OTHER PUBLICATIONS

Kozyrey, "Single–Ended Switching–Mode Tuned Power Amplifier with Filtering Circuit", Poluprovodnikovye pribory v tekhnike svyazi, 1971, pp. 152–166, vol. 6.

TimeStar™, "Multi–Mode Polar Modulator" 2002, Tropian Headquarters, USA.

Sundstrom, "Digital RF Power Amplifier Linearisers", 1995, Sweden.

Kenington, "Linearised RF Amplifier and Transmitter Techniques", Microwave Engineering Europe, Nov. 1998, pp. 35–.

Mann, et al., "Increasing Talk–Time with Effecient Linear PAs", Presented at IEE Colloquim on Tetra Market and Technology Developments, Feb. 2000, London.

Mann, et al., "Increasing the Talk–Time of Mobile Radios with Effecient Linear Transmitter Architectures", Electronics & Communication Engineering Journal, Apr. 2001, pp. 65–76, vol. 13, No. 2.

Heimbach, "Digital Multimode Technology Redefines the Nature of RF Transmission", Applied Microwave & Wireless, Aug. 2001.

Swanson, "Digital AM Transmitters", IEEE Transactions on Broadcasting, Jun. 1989, pp. 131–133, vol. 35, No. 2.

Tropian–Products Main, www.tropian.com/products/, Copyright 2000–2001, Aug. 14, 2002.

"Tropian and Agilent Technologies announce collaboration on multi–band, multi–mode 2.5G transmitter solutions", Feb. 18, 2002, Connes, France.

"Tropian Awarded 8$^{th}$ U.S. Patent for Wireless Technology: Innovative RF Power Processing Circuit Architecture Achieves Speed and Accuracy in Polar Modulation, "Aug. 6, 2001, Cupertino, California.

Dialog Web Command Mode, p. 1 of 1, Sep. 17, 2002, Record 03929207, Polar Modulators for 1 and 2 GHz Power Amplifier Correction, Nisbet, J.

Dialog Web Command Mode, p. 1 of 1, Sep. 17, 2002, Record 0326082, A new Class–AB Design, De Jager, et al., Electronics World 105, Dec. 1999, p. 982–7.

Dialog Web Command Mode, p. 1 of 1, Sep. 17, 2002, Record 2371235, Increasing the talk–time of mobile radios with efficient linear transmitter architectures, Mann et al., Electronics & Communication Engineering Journal, v. 13, No. 2, Apr. 2001 (p. 65–76).

Dialog Web Command Mode, p. 1 of 3, Sep. 17, 2002, Record 15595216, The big climate amplifier ocean circulation–sea–ice–storminess–dustiness–albedo, Broecker, Geophysical Monograph, 2001, 126, 53–56, etc.

Dialog Web Command Mode, p. 1 of 9, Sep. 19, 2002, Record 10872787, Out–of–band emissions of digital transmissions using Kahn EER technique, Rudolph, IEEE Transactions on Microwave Theory & Techniques, 2002, V 50, N 8, Aug., p. 1979–1983, etc.

Dialog Web Command Mode, p. 1 of 20, Sep. 17, 2002. Record 01239474, GSM players Eye Edge Despite Transmit Woes, Keenan, Electronic Engineering Times, 2002, n 1211, p. 6.

* cited by examiner

APPARATUS, METHODS AND ARTICLES OF MANUFACTURE FOR CONTROL IN AN ELECTROMAGNETIC PROCESSOR

FIELD OF THE INVENTION

The present invention relates generally to electromagnetic processing, and more particularly to power control in an electromagnetic processor.

BACKGROUND OF THE INVENTION

Electromagnetic waves and signals (hereinafter "waves") are utilized for many different purposes. For example, electromagnetic waves may be processed in order to convey intelligence, such as by attenuating and/or amplifying electromagnetic wave characteristics, for instance, as is seen when modulating amplitude, frequency or phase of an electrical current or radio frequency (RF) wave to transmit data. As another example, power may be conveyed along a wave in a controlled fashion by attenuating and/or amplifying electromagnetic wave characteristics, such as is seen when modulating voltage or current in a circuit. Moreover, the uses may be combined, such as when intelligence may be conveyed through a wave by processing power characteristics.

Electromagnetic wave characteristic processing may be accomplished through digital or analog techniques. Digital and analog attenuation and/or amplification may also be combined, that is, the same wave may be subject to various types of digital and/or analog attenuation and/or amplification within a system in order to accomplish desired tasks.

However, processing electromagnetic wave characteristics may be difficult. For example, choosing an appropriate technique or component to modify a wave characteristic may be difficult for a number of reasons. One of those reasons involves the type of wave to be modified. For example, low frequency waves, such as 60 Hz power waves, may need different processing techniques than high frequency waves such as 24 GHz radar waves. It is common practice therefore to use different components, with different characteristics, for different waves. For example, a switching semiconductor used within a computer for 60 Hz power waves has different power handling characteristics from a power semiconductor used in a 24 GHz radar system.

Electromagnetic processing may be useful in any number of systems, and is generally done by linear or non-linear techniques. Linear techniques generally provide an output signal with a relatively close resemblance, except for scale, to an input signal. Non-linear techniques generally provide an output signal, which does not have a relatively close resemblance to an input signal.

Either non-linear or linear amplifiers, as an example, may be useful for a number of different applications. Non-linear amplifiers may be useful for on/off amplification—that is, where there is no need to produce an accurate amplification of an input signal, but merely amplify a signal. Linear amplifiers may be useful where an accurate, amplified reproduction is desirable.

When accurate reproduction is desired, therefore, a linear amplifier has been desirable. However, the poor efficiency of a linear amplifier may make its use undesirable in some situations. Efficiency refers to the ability of the amplifier to translate DC power input into power output. A linear amplifier is less efficient than a non-linear amplifier because it draws more power than a non-linear amplifier to output a signal with the same strength. Moreover, a linear amplifier requires quiescent current, or current from a power source even when not amplifying. In applications with a limited power source, such as battery power, a non-linear amplifier may be desirable, as a non-linear amplifier typically requires very little or no quiescent current.

In some areas of signal processing, however, such as radio frequency (RF), non-linear techniques lead to less than desirable results. For example, although linear amplifiers are desirable in RF receivers because of their signal reproduction accuracy, the power draw required by linear amplifiers limits their usefulness, especially in portable, battery driven devices.

Attempts have been made in the art to overcome these difficulties. For example, amplifier combining—using multiple amplifiers to amplify the same signal—is one method that attempts to leverage linear and non-linear benefits. However such attempts to date have been constrained by various difficulties. For example, amplifier combining methods use components, such as transformers or quarter wave lines, to sum the output of the amplifiers in order to drive the load. These components add to the cost and size of the amplifier array.

Accordingly, it would be helpful to the art of electromagnetic processing if linear amplifier precision could be used in combination with the relative efficiency and low power draw characteristic of non-linear amplifiers.

SUMMARY OF THE INVENTION

Embodiments of the present invention include apparatus, methods and articles of manufacture for controlling the output characteristics of electronic devices. In connection with one embodiment, an apparatus is adapted for electromagnetic processing and comprises a controller and a processor for receiving an input signal, with the processor comprising one or more stages in communication with the controller, the controller being capable of regulating the input signal and the one or more stages to generate an output signal.

In connection with another embodiment, a method for electromagnetic processing comprises receiving an input signal comprising an amplitude component and a phase component, regulating a characteristic of the phase component by control signals from a controller and generating an output signal based upon an amplitude component.

DETAILED DESCRIPTION

Figure 1:
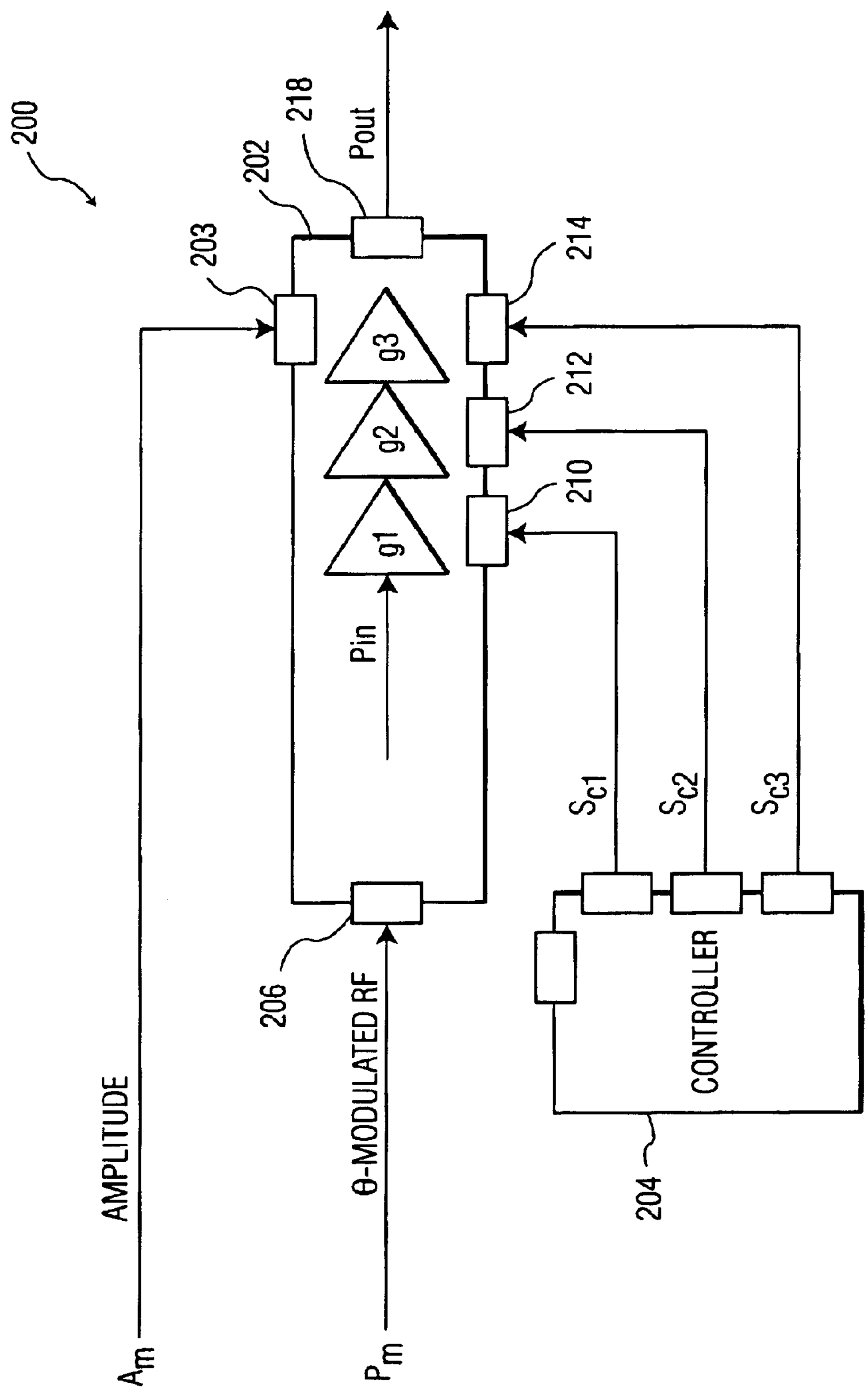
FIG. 1 is a block diagram of an exemplary embodiment of a control system in accordance with the present invention.

Embodiments of the present invention include apparatus, methods and articles of manufacture adapted for processing of electromagnetic waves and signals. Embodiments of the present invention include control systems adapted for use in electromagnetic processing. For illustration purposes, an exemplary embodiment of a control system is illustrated in FIG. 1. As should be understood, the control system disclosed herein may be implemented in a wide range of applications, such as, for example, an amplifier, an attenuator, a transmitter, a receiver, a transducer or other electromagnetic processor.

It should be noted that the term "signal" is used herein to describe an electromagnetic wave that has been processed in some fashion. In addition, the term "signal" as is used herein should be broadly construed to include any manner of conveying data from one place to another, such as, for example, an electric current or electromagnetic field, including without limitation, a direct current that is switched on and off or an alternating-current or electromagnetic carrier that contains one or more data streams. Data, for example, may be superimposed on a carrier current or wave by means of modulation, which may be accomplished in analog or digital form. The term "data" as used herein should also be broadly construed to comprise any type of intelligence or other information, such as, for example and without limitation, audio, such as voice, text and/or video, etc.

FIG. 1 shows one embodiment of a system 200 comprising a processor 202, such as an amplifier, and a controller 204. In other embodiments, the processor 202 may comprise other components, such as, for example, and D/A converter. An input signal is represented in FIG. 1 by an amplitude component am and phase-modulated component pm. The amplitude component am may comprise a low frequency signal while the phase component pm may be modulated onto a high frequency RF carrier.

The amplifier 202 illustrated in FIG. 1 comprises a control port 203 and a control port 206. The control port 203 receives the amplitude component am, which may affect the amplification of the input signal, as described in more detail below. Similarly, the control port 206 receives the phase component pm, which may affect the phase and/or amplification of the input signal as described below. The amplitude component am and phase component pm may be generated in any manner. In one embodiment, I,Q data is converted by a signal modulator into a polar signal to create an analog or digital data control signal that contains the amplitude component of the input signal, am, and an electromagnetic signal that contains the phase wave component of the input signal, pm. For example, a rectangular to polar converter may be used to output polar coordinates in the form R, P(sin) and P(cos). The R coordinate represents the amplitude characteristic of the wave. The P(sin) and P(cos) coordinates represent the phase characteristic of the wave.

In the illustrated embodiment, the amplifier 202 comprises one or more biasing stages, such as, for example, three biasing stages as shown, and with each biasing stage having an associated control port $s_{c1}$ 210, $s_{c2}$ 212, and $s_{c3}$ 214. In this embodiment, the controller 204 is in communication with control ports $s_{c1}$ 210, $s_{c2}$ 212 , and $s_{c3}$ 214 of the three biasing stages via lines $s_{c1}$, $s_{c2}$ and $s_{c3}$. In general, controller 204 may be used to regulate each biasing stage via lines $s_{c1}$, $s_{c2}$ and $s_{c3}$ to control gain of the amplifier 202. It should be understood that an amplifier 202 having three biasing stages is an exemplary embodiment and that amplifiers having any number of stages and any number of control ports may also be utilized. The amplifier 202 further comprises an output port 218 in this embodiment. Preferably, the amplifier 202 controls the amount of reference voltage of each biasing stage of the amplifier in the course of processing the amplitude component am and the phase component pm at a rate controlled by control ports $s_{c1}$ 210, $s_{c2}$ 212, and $s_{c3}$ 214, and provides an output signal, such as Pout at output port 218 illustrated in FIG. 1.

A plurality of transfer characteristics may exist in the present embodiment between the input port 206, the control ports $s_{c1}$ 210, $s_{c2}$ 212, and $s_{c3}$ 214 and the output port 218. The transfer characteristics may be, for example, voltage, current, power, ACPRn(where n may be any integer value), RHO, phase change, AM/AM or AM/PM characteristics, phase noise, BER, etc. For example, one or more characteristics of the output signal Pout, such as voltage, current and/or power, may be represented as a function of one or more of the the control signals at the control ports $s_{c1}$ 210, $s_{c2}$ 212, and $s_{c3}$ 214. The output signal Pout, therefore, in one embodiment may take the form:

$$f(s_0)=f(s_{c1},s_{c2},s_{c3}) \qquad \text{Equation 1}$$

where $s_{c1}, s_{c2}, s_{c3}$ represent control signals at control ports $s_{c1}$ 210, $s_{c2}$ 212, and $s_{c3}$ 214, respectively. The control signals select an operating point on a transfer characteristic curve for a device.

Figure 1A:
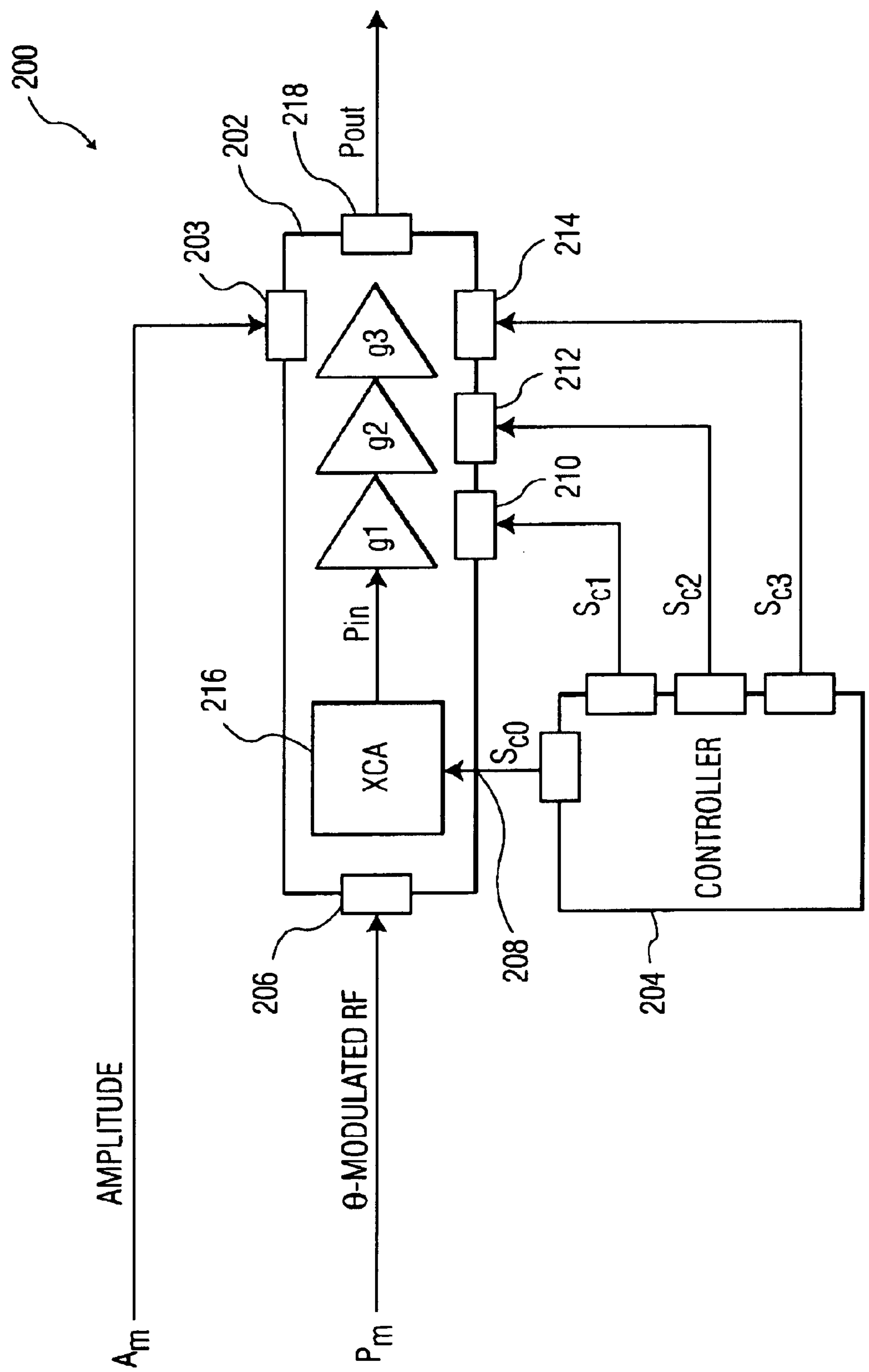
FIG. 1A is a block diagram of another exemplary embodiment of a control system in accordance with the present invention.

As shown in FIG. 1A, the system 200 may further include in other embodiments an input device such as an attenuator 216, or, alternatively, an amplifier, which may be implemented in hardware or software or a combination of hardware and software. In the embodiment illustrated in FIG. 1A, the attenuator 216 is provided as a part of amplifier 202, however, as should be understood, this is not required, and the attenuator 216 may be provided as a separate device where desired. Amplifier 202 further includes a control port 208 for receiving a control signal $s_{c0}$ from controller 204. In this embodiment, control signal $s_{c0}$ and phase component pm are input to the attenuator 216, and attenuator 216 outputs a signal Pin that is then input to the first biasing stage of amplifier 202. In general, control signal $s_{c0}$, in combination with attenuator 216, may be used to regulate signal Pin. In this embodiment, control signal $s_{c0}$ and attenuator 216 are adapted to regulate either one or both of the power level and dynamic range of signal Pin input to the first stage of amplifier 202. Although FIG. 1A depicts an attenuator 216 as part of the amplifier 202, it should be understood that the attenuator 216 alternatively may be external to the amplifier 202. In one embodiment, the attenuator 216 sets a characteristic of Pin, such as, for example, the power level. In relation to this exemplary embodiment, the output signal Pout, therefore, may take the form:

$$f(s_0)=f(s_{c0},s_{c1},s_{c2},s_{c3}) \qquad \text{Equation 2}$$

where $s_{c0}$ represents the power-in signal Pin, and $s_{c1}$ $s_{c2}$ $s_{c3}$ represent control signals at control ports $s_{c1}$ 210, $s_{c2}$ 212, and $s_{c3}$ 214, respectively. As mentioned above, the control signals and the power-in signal Pin select an operating point on a transfer characteristic curve for a device, as is described in more detail below.

Figure 2:
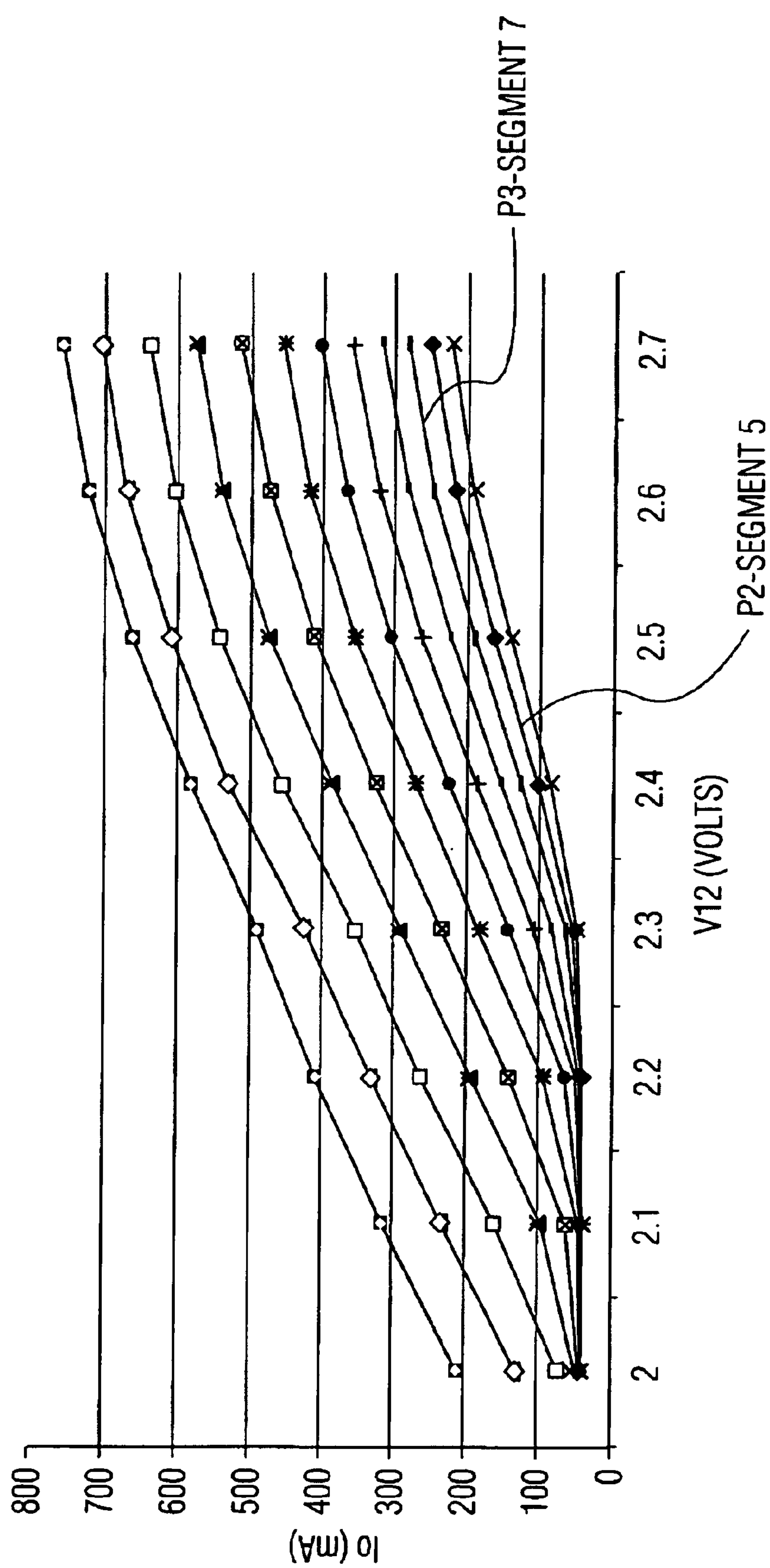
FIG. 2 is a graph illustrating transfer characteristics of the embodiment of FIG. 1A.
Figure 3:
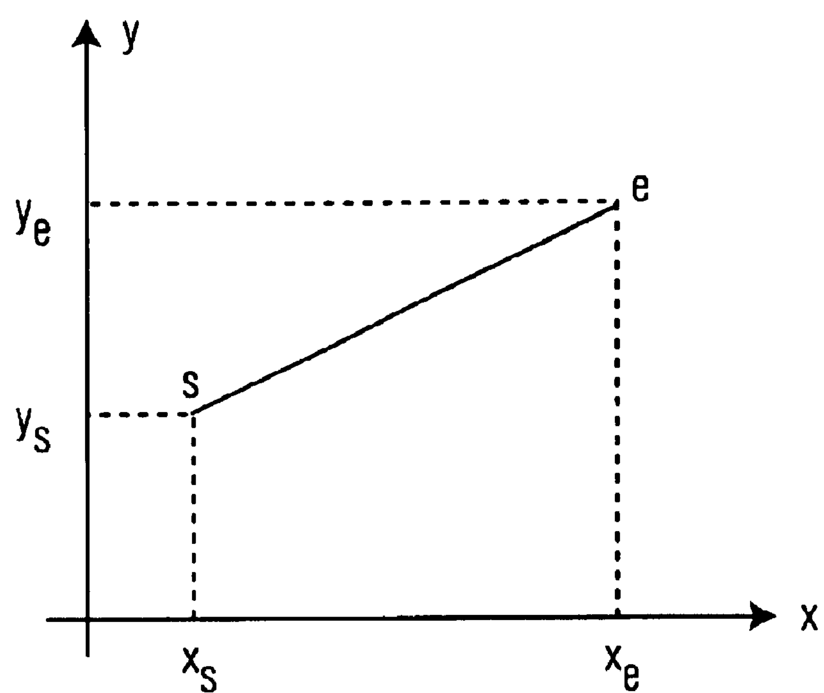
FIG. 3 is a graph illustrating modeling of the transfer characteristics of FIG. 2.

To illustrate embodiments of the invention, the transfer characteristics of an exemplary device are treated as linear segments for certain specified ranges of control signals. FIG. 2 depicts a sample of the transfer characteristics of an exemplary device, such as amplifier 202, wherein a control parameter of one of the control signals at a control port, such as port $s_{c1}$ 210, is a voltage. The control voltage is a variable that may be selected as desired. For purposes of illustration only, in one exemplary embodiment, the control voltage may be varied over a range from 2 to 2.7 volts, at 0.1 volt resolution. Similarly, the resolution is a variable that can be selected however as desired. Each curve on the graph shown in FIG. 2 represents the transfer characteristics of an exemplary device at a Pin over an exemplary range of −12 to 2 dBm, at 1 dBm resolution. The transfer characteristics between any two 0.1 volt intervals are linear segments, as depicted in FIG. 3.

The linear equation for any segment on the transfer characteristic curves depicted in FIG. 2 may be represented by the following equation:

$$y_n^{P_1} = \frac{(y_e - y_s)}{(x_e - x_s)} \cdot (x - x_e) + y_e \quad \text{Equation 3}$$

where "s" and "e" denote start and end points on the segment. Consequently, $x_e$ and $y_e$ become the x and y intercepts of the segment respectively. Superscript "Pi" identifies the characteristic curve corresponding to input power Pin, while subscript "n" is used to identify a segment on the same curve. The value of Pin determines on which curve lies the operating segment of the device. The control signal, such as for example the voltage at control port $s_{c1}$ 210 illustrated in FIG. 2, determines which segment on the curve represents the operating segment of the device.

controlling characteristics in the illustrated exemplary embodiment generally involves movement from one operating point on a transfer characteristic curve, i.e. a serving segment, to another operating point on the same or another transfer characteristic curve, i.e. a target segment. For example, referring back to FIG. 2, when a movement from operating curve P2-segment 5 to P3-segment 7 is desired, the operating point of the amplifier 202 must shift from a segment $$y_5^{P_2} = \frac{(y_e - y_s)}{(x_e - x_s)} \cdot (x - x_e) + y_e \quad \text{Equation 4}$$

to a segment $$y_7^{P_3} = \frac{(y_e - y_s)}{(x_e - x_s)} \cdot (x - x_e) + y_e \quad \text{Equation 5}$$

The start and end points of the segments in equations 2 and 3 depend on the location of the respective segments on the transfer characteristic curves.

In a preferred embodiment, the serving segment and/or target segment are defined according to an output characteristic. The output characteristic may be defined by a controlling variable. For example, assume a decision is made to move from a characteristic of an output signal $Pout_1$, such as current, voltage or power, to a characteristic of an output signal $Pout_2$. An output stimulus vector comprising elements $s_{c0}^1$, $s_{c1}^1$, $s_{c2}^1$, and $s_{c3}^1$ would be associated with output signal $Pout_1$ and a target stimulus vector comprising $s_{c0}^2$, $s_{c1}^2$, $s_{c2}^2$, and $s_{c3}^2$ would be associated with the desired output signal $Pout_2$. The output characteristic would then determine which element or elements of the stimulus to vary. For example, in an embodiment wherein the output characteristic is to minimize output current, the controlling variable may be defined as follows:

$$ControllingVariable = f\left[\min\left(\frac{dI_o}{ds_{c0}}, \frac{dI_o}{ds_{c1}}, \frac{dI_o}{ds_{c2}}, \frac{dI_o}{ds_{c3}}\right)\right] \quad \text{Equation 6}$$

and the characteristic to follow in determining which element or elements of the stimulus to vary would be the minimum per unit change in current against $s_{c0}$, $s_{c1}$, $s_{C2}$ and $s_{c3}$.

Figure 4:
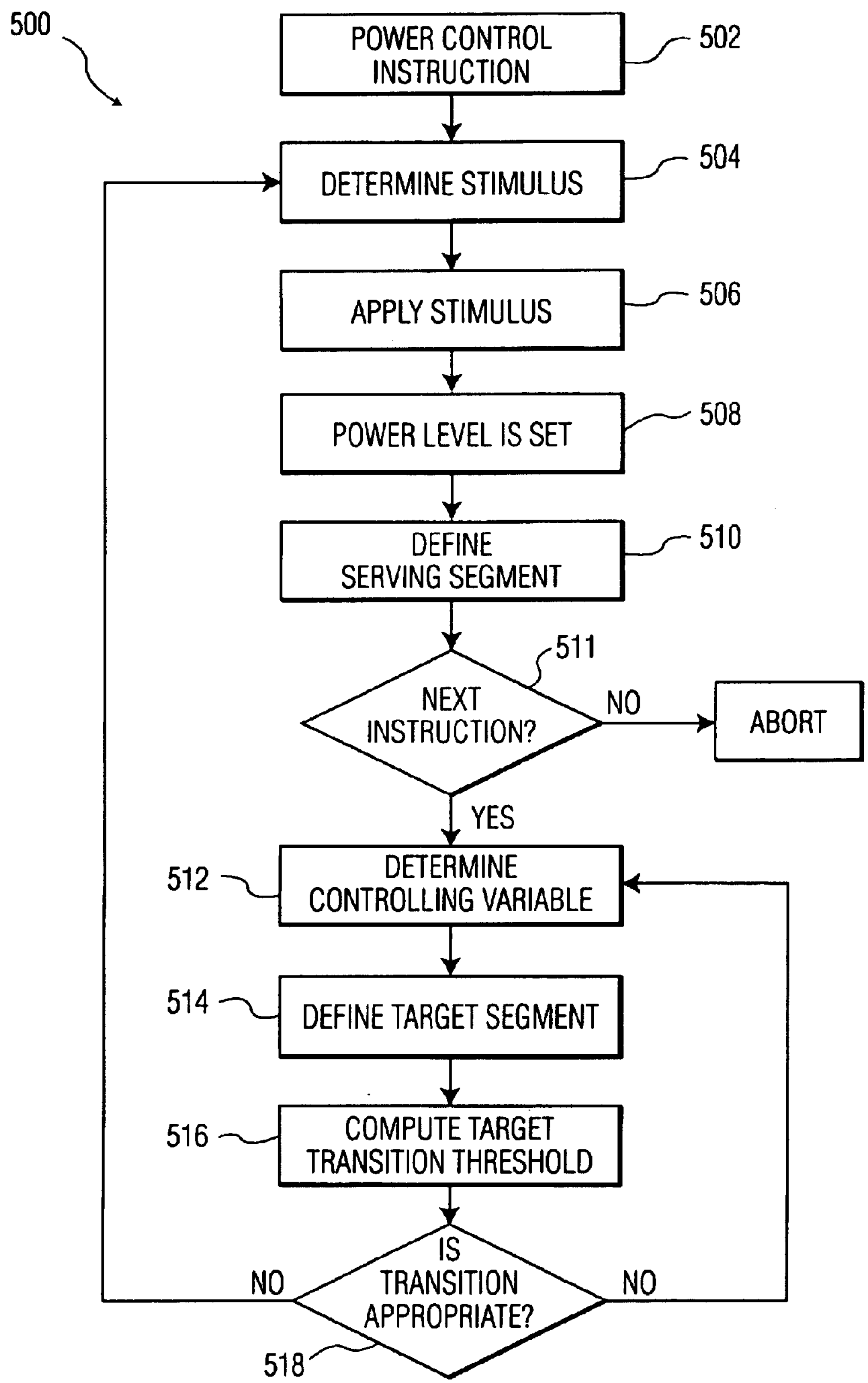
FIG. 4 is a flow chart illustrating an exemplary embodiment of a method for power control.

Methods according to embodiments of the invention may be understood from the description of the structure and function of elements of the invention provided herein. FIG. 4 depicts a flow chart of an additional embodiment of a method 500 of controlling the output of a device, such as amplifier 202 illustrated in FIG. 1. For purposes of illustration, the method in the described embodiment relates to control of an amplifier, subject to meeting a set of constraints, such as, for example, voltage, current, power, ACPRn (where n may be any integer value), RHO, phase change, AM/AM or AM/PM characteristics, phase noise, BER, etc. A control instruction, such as an output characteristic, is received by the control system at step 502. Preferably, the control instruction is received by a controller at step 204. Next, the controller determines a stimulus at step 504, then applies the stimulus to the processor being controlled by the control system at step 506. The stimulus may then act on the processor to generate an output signal. Either after or substantially contemporaneous with applying the stimulus 506, a characteristic of the input power Pin, such as the power level, is set at step 508. Setting a characteristic of the input power Pin and applying a stimulus to the processor defines a serving segment 510 on a transfer characteristic curve of the processor, as described above in connection with FIG. 2.

A second control instruction is received by the control system at step 511. The second control instruction 511 may be an output characteristic. A controlling variable associated with the output characteristic is determined at step 512, and a target segment is defined at step 514 based on the controlling variable. The target segment represents the segment on a transfer characteristic curve that will produce the desired Pout according to the second control instruction.

In one embodiment, the method described in FIG. 4 further comprises the steps of computing a target transition threshold at step 516. After the threshold has been computed, a determination is made whether the requested transition from the serving segment to the target segment is appropriate at step 518. The criteria for deciding whether the transition is appropriate may relate to minimum or maximum limits on the rate of change of one or more of the controlling variables, or one or more of the characteristics of the output of the processor. If the transition is not appropriate, a new controlling variable may be determined at step 512, or a new stimulus at step 504 is introduced.

Figure 5:
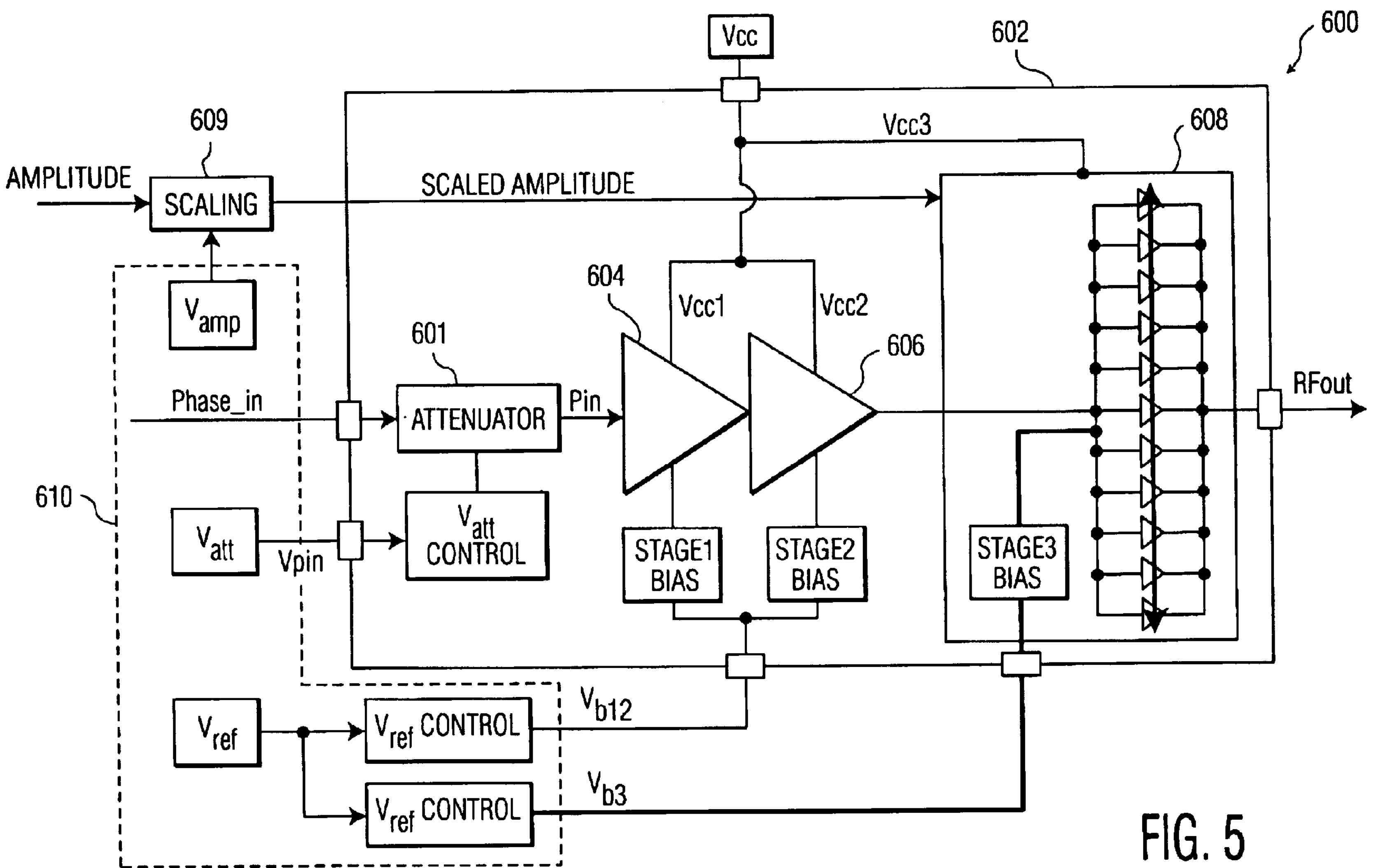
FIG. 5 is a block diagram of another exemplary embodiment of a control system in accordance with the present invention.

In an exemplary embodiment, a method described in connection with FIG. 4 may be applied to an alternative embodiment of a control system, as illustrated in FIG. 5. FIG. 5 shows a control system 600 comprising an attenuator 601, such as a voltage controlled attenuator, an amplifier 602 having a first stage 604, a second stage 606 and a third stage 608, and a controller 610. In this embodiment, first stage 604 and second stage 606 are each Voltage Gain Amplifiers. The third stage 608 may be a transistor array comprised of a plurality of transistors or transistor segments, which total eleven in this embodiment as an example. In addition, in certain embodiments, amplifier 602 may be implemented so as to receive separate amplitude and phase components, such as shown in FIG. 1. For example, the amplitude component may be used to control the various transistors/segments, such as by regulating one or more bias control components connected with the transistors/segments. The bias control components may comprise, for example, switching transistors, which may operate as current sources where desired. The amplitude component may comprise, for example, a digital word received by the bias control components, such that if a bit is "1" or "high", the corresponding bias control component is switched on and current flows to the appropriate transistor/segment.

The controlling characteristic sent by the controller 110 for each respective control signal is a voltage in this exemplary embodiment. A voltage control signal Vpin is received by the attenuator 601 to set the power level Pin to the amplifier 602. The controlling voltages of the first stage 604 and the second stage 606 of the amplifier 602 are each controlled by a regulated voltage Vb12 in this embodiment. In other embodiment, the first stage 604 and the second stage 606 may be independently controlled by separate control signals. The control voltage for the third stage 608 is shown as Vb3. The control voltages received by the amplifier 602 may be DC bias control voltages that bias one or more stages of the amplifier 602. In this embodiment, the bias currents of segment drivers are controlled by voltage Vb3. The Vb12 and Vb3 voltages impact the biasing circuitry exclusively, while a voltage Vcc powers the remainder of the circuitry of amplifier 602. The total average output power Pout of amplifier 602 and the output current associated with Pout can be illustrated by examining the transfer characteristics of the amplifier 602 at various values of Pin.

In addition, in connection with various embodiments of the present invention, the aspect of scaling of a particular signal may also be implemented where desired. As will be described in more detail below, there are several alternative approaches that may be utilized to accomplish scaling with the various embodiments of the present invention. In general, scaling may be performed in either baseband or RF, or alternatively, in both baseband and RF in combination. For example, with reference to the embodiment shown in FIG. 5 (and similarly, with the embodiment shown in FIG. 1), scaling may be accomplished in baseband by either hardware or software, such as, for example, by modifying filter coefficients, which is represented by an input device comprising a scaling component 609 for illustration purposes. In this embodiment, scaling component 609 operates by receiving a control signal Vamp from controller 610 to adjust the peak-to-peak level of the envelope of the amplitude component, which impacts the operations of the third stage 608. Further, in the embodiment of FIG. 5, scaling may also (or alternatively) be accomplished in RF as part of the Vb3 control of third stage 608. Similarly, with the embodiment of FIG. 1, scaling may be accomplished as part of the $S_{c3}$ control of third stage g3.

Figure 6:
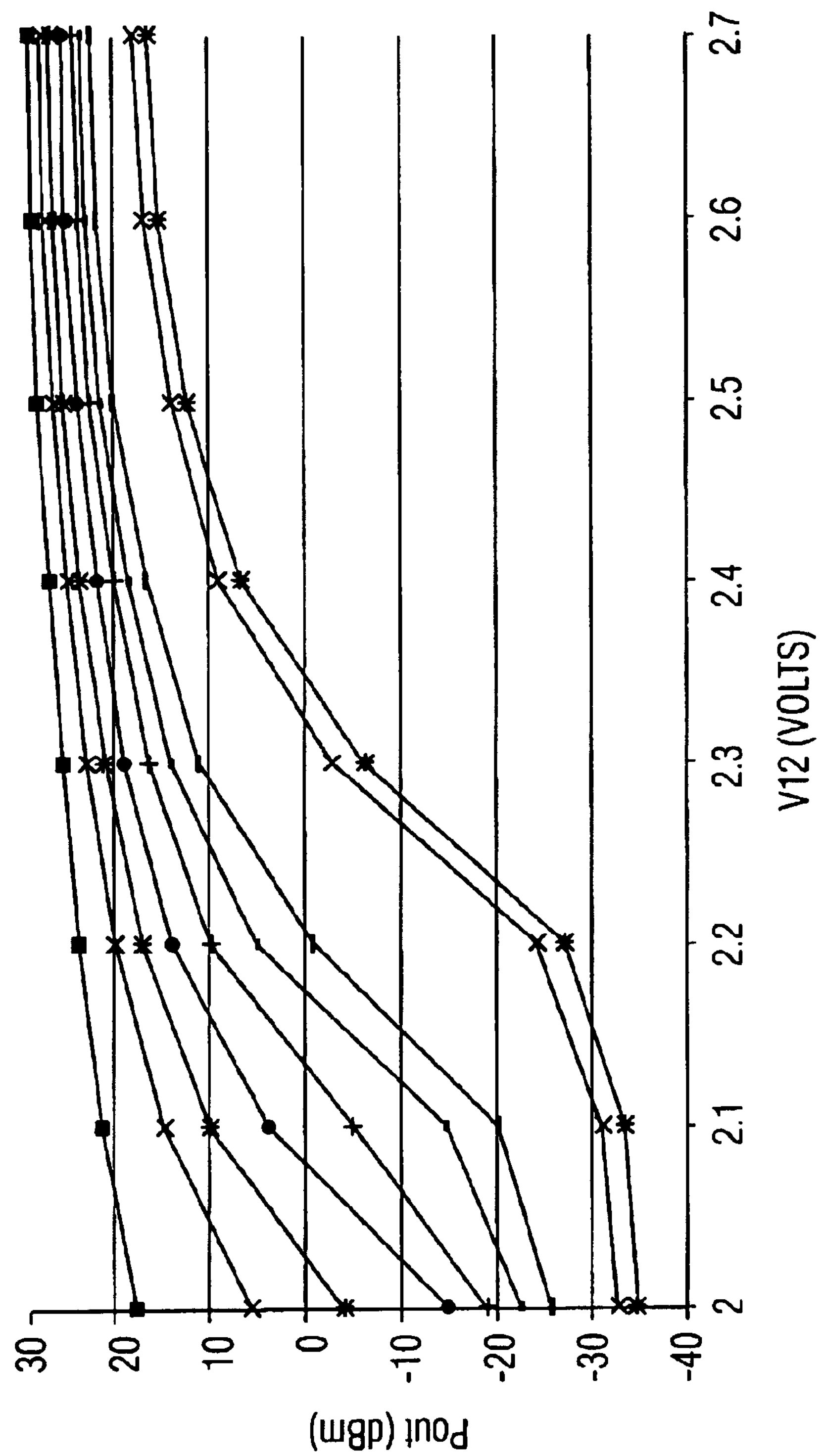
FIGS. 6 and 7 are graphs showing transfer characteristics of the exemplary embodiment of FIG. 5.
Figure 7:
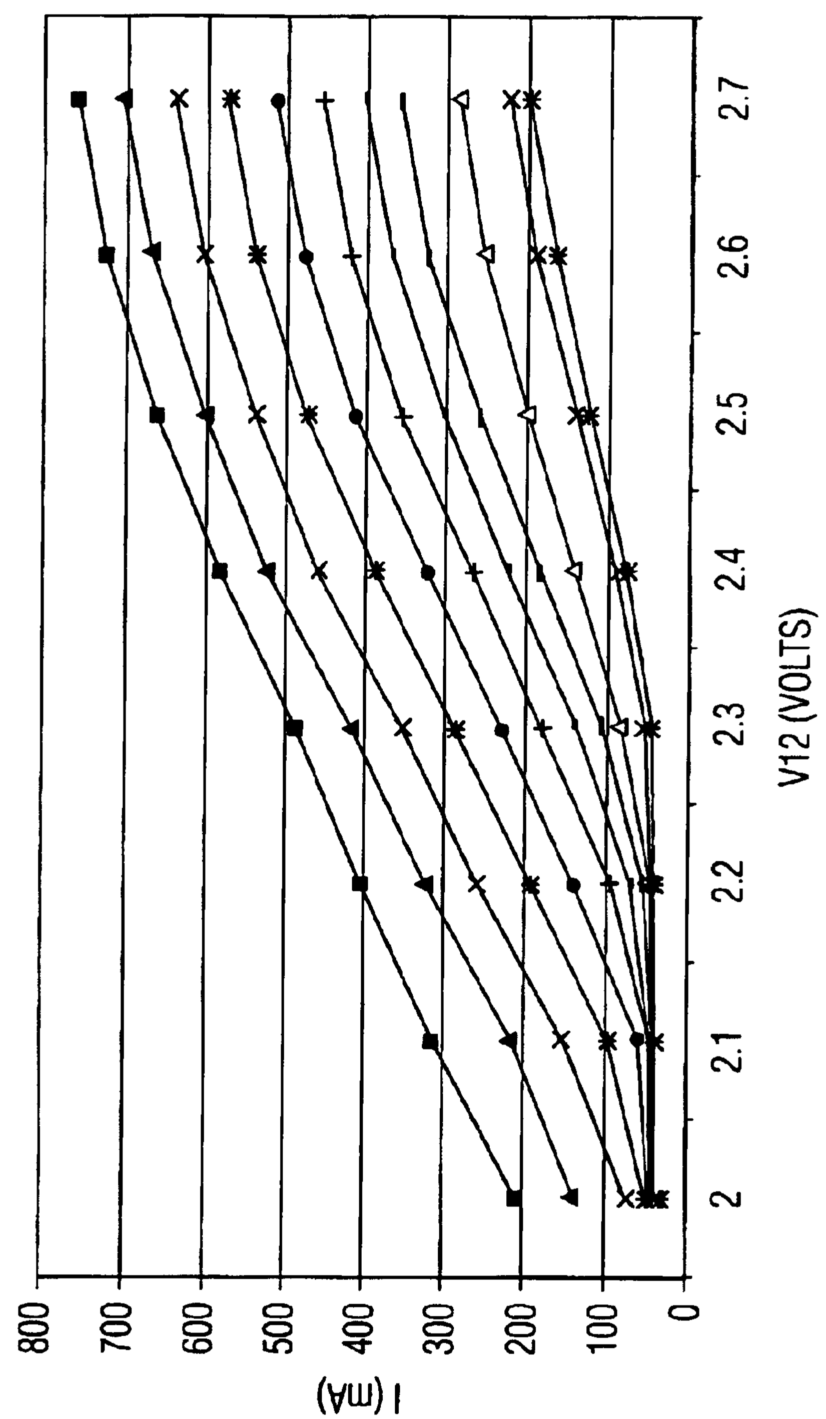

FIGS. 6 and 7 show the transfer characteristic curves of the exemplary embodiment of the amplifier 602 shown in FIG. 5 for values of Pin ranging from −12 dBm to 1 dBm. Each continuous line shown on the figures represents a value of Pin in the specified range. FIG. 6 shows Pout over a range of 2 to 2.7V for Vb12 at a constant value of 2.6V for Vb3. FIG. 7 shows Iout under the same conditions.

In some embodiments, for example, with certain transmitter, receiver; and transceiver embodiments, the devices may be specialized for particular input signals, carrier waves and output signals, e.g. various types of cell phones, such as CDMA, CDMA2000, W-CDMA, GSM, TDMA, as well as various other types of devices, both wired and wireless, e.g. Bluetooth, 802.11a, -b, -g, radar, 1×RTT, radios, GPRS, computers and computer or non-computer communication devices, handheld devices, etc. Among the modulation schemes supported by the various embodiments include, for example, GMSK, which is used in GSM; GFSK, which is used in DECT & Bluetooth; 8-PSK, which is used in EDGE; OQPSK & HPSK, which are used in IS-2000; p/4 DQPSK, which is used in TDMA; and OFDM, which is used in 802.11.

Embodiments disclosed herein may utilize both analog and digital components, where desired, insofar as these embodiments manipulate waves and signals requiring both. For example, cell phone embodiments may utilize both analog and digital components. Various types of system architectures may also be utilized for constructing the embodiments. For example, embodiments or various components may be provided on a semiconductor processor where desired, such as an integrated circuit or an application-specific integrated circuit composition; some examples include silicon (Si), silicon germanium (SiGe) or gallium arsenide (GaAs) substrates.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. One of ordinary skill in the art will accordingly appreciate that embodiments of the invention or various components and/or features thereof may be entirely comprised of hardware, software and/or may be a combination of software and hardware. Accordingly each of the blocks of the drawings, and combinations of blocks of the drawings, may be embodied in many different ways, as is well known to those of skill in the art. Accordingly, the foregoing description is by way of example only, and not limiting. The invention is limited only as defined in the following claims and equivalents thereto.

What is claimed is:

1. An apparatus adapted for electromagnetic processing comprising:

a controller;

a processor comprising one or more stages in communication with the controller, the processor being adapted to receive a first amplitude signal and a first phase signal;

the controller being capable of regulating the first phase signal and the one or more processor stages independent of said first amplitude signal and said first phase signal to generate an output signal.

2. An apparatus of claim 1, wherein the one or more stages are regulated by control signals from the controller.

3. An apparatus of claim 2, wherein the one or more stages include a last stage comprising a transistor array.

4. An apparatus adapted for electromagnetic processing comprising:

a controller; and, a processor comprising one or more stages in communication with the controller, the processor being adapted to receive an input signal, the controller being capable of regulating the input signal and the one or more processor stages independent of the input signal to generate an output signal, wherein the one or more processor stages include a last stage comprising a transistor array, and wherein the input signal comprises an amplitude component received by the last stage for regulating operation of the transistor array.

5. An apparatus of claim 4, wherein the input signal further comprises a phase component received by the one or more stages, with the control signals from the controller regulating operation of the one or more stages to output a regulated phase component.

6. An apparatus of claim 5, wherein the regulated phase component is received by the last stage and the last stage is regulated by a combination of the control signals from the controller and the amplitude component in order to generate the output signal.

7. An apparatus adapted for electromagnetic processing comprising:

a controller; and, a processor comprising one or more stages in communication with the controller, the processor being adapted to receive first input signal, the controller being capable of regulating the first input signal and the one or more processor stages with at least one second input signal to generate an output signal, wherein the at least one second input signal is independent from the first input signal, and wherein the first input signal comprises an amplitude component and a phase component received by the processor, the controller being capable of regulating at least one of the amplitude component or the phase component to generate the output signal.

8. An apparatus of claim 7, further comprising an input device in communication with the controller and the one or stages, wherein the input device receives at least one of the phase component or the amplitude component of said first input signal, with the controller sending control signals to regulate said input device in order to generate an input signal for input to the one or more stages.

9. An apparatus of claim 8, wherein the input device comprises one of an amplifier or an attenuator for receiving the phase component of the first input signal.

10. An apparatus of claim 8, wherein the input device comprises a scaling component for receiving the amplitude component of the first input signal.

11. An apparatus of claim 8, wherein the one or more stages comprise biasing.

12. An apparatus of claim 8, wherein the one or more stages comprise a defined number of transistors.

13. An apparatus of claim 8, wherein the one or more stages comprises a defined number of amplifiers and a last stage comprising a transistor array, wherein each of the one or more stages are connected with one another.

14. A method for electromagnetic processing comprising:

receiving an input signal comprising an amplitude component and a phase component;

regulating the phase component of the input signal through the application of at least one control signal independent of said input signal issued by a controller thereto, and through application of the amplitude component thereto; and, generating an output signal based upon the regulated phase component of the input signal.

15. A method of claim 14, wherein the step of regulating further comprises:

providing one or more stages connected together and with each of the one or more stages being in communication with the controller; and regulating operation of the one or more stages by at least one control signals from the controller, wherein said at least one control signal is independent of said input signal.

16. A method of claim 15, wherein the step of regulating further comprises:

providing one of an attenuator or an amplifier in connection with a first of the one or more stages; and regulating operation of the attenuator or the amplifier by control signals from the controller to effect a characteristic of the phase component received by the first of the one or more stages.

17. A method of claim 14, wherein the step of generating further comprises:

providing a scaling component receiving the amplitude component;

regulating operation of the scaling component by control signals from the controller to effect a characteristic of the amplitude component.

18. A method of claim 17, wherein the step of generating further comprises:

providing a last of the one or more stages in communication with the scaling component; and regulating operation of the last of the one or more stages by the amplitude component received from the scaling component.

19. An article of manufacture comprising the apparatus of claim 7.

20. An article of manufacture of claim 19 comprising an integrated circuit.

* * * * *